(12) United States Patent
Mataki

(10) Patent No.: US 8,609,006 B2
(45) Date of Patent: Dec. 17, 2013

(54) PATTERN TRANSFER APPARATUS AND PATTERN FORMING METHOD

(75) Inventor: Hiroshi Mataki, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 328 days.

(21) Appl. No.: 12/923,027

(22) Filed: Aug. 30, 2010

(65) Prior Publication Data

US 2011/0049761 A1 Mar. 3, 2011

(30) Foreign Application Priority Data

Aug. 31, 2009 (JP) ................................ 2009-200522

(51) Int. Cl.
*B29C 59/02* (2006.01)

(52) U.S. Cl.
USPC ............................ 264/293; 425/385; 264/40.1

(58) Field of Classification Search
USPC ............... 425/174.4, 385, 150; 264/492, 293, 264/40.1, 40.5, 40.7
See application file for complete search history.

(56) References Cited

U.S. PATENT DOCUMENTS

| | | | |
|---|---|---|---|
| 7,027,156 B2 * | 4/2006 | Watts et al. ................. | 356/401 |
| 7,093,916 B2 * | 8/2006 | Endo ............................ | 347/19 |
| 7,316,554 B2 * | 1/2008 | Choi et al. .................... | 425/210 |
| 7,491,637 B2 | 2/2009 | Sreenivasan et al. | |
| 7,618,250 B2 * | 11/2009 | Van Santen et al. .......... | 425/171 |
| 8,215,946 B2 * | 7/2012 | GanapathiSubramanian et al. ............................ | 425/400 |
| 2004/0239853 A1 | 12/2004 | Sakurada | |
| 2005/0098534 A1 | 5/2005 | Sreenivasan et al. | |
| 2005/0106321 A1 | 5/2005 | McMackin et al. | |
| 2005/0147743 A1 * | 7/2005 | Sekiya ........................ | 427/140 |
| 2006/0012058 A1 * | 1/2006 | Hasei ........................... | 264/1.32 |
| 2006/0062867 A1 * | 3/2006 | Choi et al. .................. | 425/174.4 |
| 2007/0026542 A1 | 2/2007 | Sreenivasan et al. | |
| 2007/0114686 A1 * | 5/2007 | Choi et al. .................... | 264/2.7 |
| 2007/0190200 A1 * | 8/2007 | Cherala et al. ................ | 425/385 |

(Continued)

FOREIGN PATENT DOCUMENTS

JP 2004-295093 A 10/2004
JP 2007-516862 6/2007

(Continued)

OTHER PUBLICATIONS

Notification of Reasons for Rejection issued by JPO on Sep. 25, 2013 in connection with corresponding Japanese Patent Application No. 2010-187299.

*Primary Examiner* — Joseph S Del Sole
*Assistant Examiner* — Nahida Sultana
(74) *Attorney, Agent, or Firm* — Jean C. Edwards; Edwards Neils PLLC

(57) ABSTRACT

The pattern transfer apparatus includes: a liquid ejection device having liquid ejection ports through which droplets of liquid are ejected and deposited onto a substrate surface while the liquid ejection device relatively moves to scan the substrate surface in a relative scanning direction; and a stamp having a stamp surface on which a pattern is formed, the stamp surface being applied to the droplets of the liquid on the substrate surface in a stamp application direction while the stamp is relatively moved with respect to the substrate, wherein when defining, on the substrate surface, strips which are straight and parallel to the stamp application direction and have widths substantially equal to diameters of the droplets deposited on the substrate surface, at least one of the strips includes the droplets which are ejected respectively from at least different two of the liquid ejection ports of the liquid ejection device.

14 Claims, 15 Drawing Sheets

(56) References Cited

U.S. PATENT DOCUMENTS

| | | |
|---|---|---|
| 2007/0228609 A1* | 10/2007 | Sreenivasan et al. ......... 264/319 |
| 2007/0289530 A1 | 12/2007 | Kataho et al. |
| 2008/0229948 A1 | 9/2008 | Washiya et al. |
| 2009/0214686 A1 | 8/2009 | Sreenivasan et al. |
| 2010/0092684 A1 | 4/2010 | Kataho et al. |
| 2010/0247757 A1* | 9/2010 | Inoue ............................ 427/162 |
| 2010/0270712 A1* | 10/2010 | Ishii et al. .................... 264/496 |
| 2011/0215506 A1* | 9/2011 | Okamoto et al. ............. 264/401 |
| 2011/0221807 A1* | 9/2011 | Yoshida ............................ 347/9 |
| 2013/0101867 A1* | 4/2013 | Yukinobu et al. ............. 428/702 |

FOREIGN PATENT DOCUMENTS

| | | |
|---|---|---|
| JP | 2007-313439 | 12/2007 |
| JP | 2008-230027 | 10/2008 |
| WO | WO 2005/047975 | 5/2005 |

* cited by examiner

PATTERN TRANSFER APPARATUS AND PATTERN FORMING METHOD

CROSS-REFERENCE TO RELATED APPLICATIONS

The present application claims priority from Japanese Patent Application No. 2009-200522, filed Aug. 31, 2009, the contents of which are herein incorporated by reference in their entirety.

BACKGROUND OF THE INVENTION

1. Field of the Invention

The present invention relates to a pattern transfer apparatus and a pattern forming method, and more particularly to a pattern transfer apparatus and a pattern forming method whereby a pattern is transferred onto a substrate by applying a mold on which the pattern has been formed onto a surface of the substrate on which liquid has been applied, curing the liquid, and then removing the mold.

2. Description of the Related Art

Photo nanoimprint lithography is known as a method of forming patterns in a manufacturing process which requires high-resolution processing, such as semiconductor device fabrication. In the photo nanoimprint lithography, a mold having topological patterns is pressed onto a surface of a substrate on which a resist layer has been applied, whereupon the resist layer is cured by light and the mold is then removed, thereby transferring the topological patterns to the resist layer on the surface of the substrate.

Japanese Patent Application Publication No. 2007-313439 discloses a resin application apparatus which includes: an inkjet device having actuators adapted to be controlled so as to intermittently eject droplets of resin liquid from a plurality of nozzle holes arranged in an array to deposit the droplets of resin liquid onto a surface of a substrate; and a linear or rotational drive device adapted to move the inkjet device and the substrate relatively at least in a direction perpendicular to the array of the nozzle holes or in a rotational direction. In order to form an extremely thin film of the resin (resist layer) of uniform thickness on the substrate surface, the resin liquid droplets are deposited on the substrate surface by the inkjet device, and then the liquid resin droplets are caused to spread on the substrate surface by spin coating.

Japanese Patent Application Publication No. 2007-516862 discloses an imprint method in which, in order to avoid trapping of gas (bubbles) in an imprint layer once patterned surface is formed, a mold is positioned so that the mold surface forms an oblique angle with respect to the substrate surface on which the imprint layer has been applied, referred to as cantilevering impingement. The mold is rotated so that all of droplets of the imprint material spread to become included in continuous sheet.

Japanese Patent Application Publication No. 2008-230027 discloses an imprint device in which a fluid is discharged toward a rear surface of a stamper opposing to the surface on which a micropattern is created or a rear surface of a material to be transferred opposing to the surface which comes into contact with the stamper so as to bend the stamper or the material to be transferred, in order to obtain an imprinted structure having a thin uniform pattern forming layer on the material to be transferred, by flattening waviness on a nanometer scale present on the surface of the material to be transferred, and reducing an unobstructed flow of a resin due to a locally loaded pressure on the material to be transferred and/or the stamper.

However, in the related art described above, when applying the liquid onto the substrate, there are problems of the following kinds in preventing non-uniformity in the film thickness and achieving uniform film thickness. For example, in the method described in Japanese Patent Application Publication No. 2007-313439, there are problems in that although uniform film thickness is achieved, costs increase due to the inclusion of additional steps, such as spin coating, and furthermore the method cannot be used when the liquid should be partially applied, to a portion to be imprinted, because the liquid is made to spread over the whole of the substrate surface ultimately by spin coating. Moreover, although Japanese Patent Application Publication No. 2007-516862 discloses that the mold is obliquely positioned to the substrate and rotated, it is silent about the deposition pattern in the liquid deposition by the inkjet in order to prevent non-uniformity in the film thickness. Furthermore, although Japanese Patent Application Publication No. 2008-230027 discloses that the stamper or the material to be transferred is bent and pressed so as to obtain the thin uniform pattern forming layer on the material to be transferred, it is also silent about prevention of non-uniformity in the film thickness when applying the resin layer onto the substrate.

When applying an imprint material onto a substrate, it is beneficial to use an inkjet head having a plurality of nozzles to eject liquid droplets of the material in order to improve productivity; however, if a plurality of nozzles are used, then the liquid ejection volume can vary with each nozzle, and if the liquid ejection is performed without any adjustment, the variations in the liquid ejection volume cause non-uniformity in the film thickness of the material during the imprint process. In the related art, there have been virtually no improvements of the deposition pattern when depositing the liquid of the imprint material to the substrate by the inkjet method.

SUMMARY OF THE INVENTION

The present invention has been contrived in view of the foregoing circumstances, an object thereof being to provide a pattern transfer apparatus and a pattern forming method whereby, even if there exist variations between nozzles when depositing liquid of an imprint material onto a substrate by an inkjet method, non-uniformity in the film thickness of the imprint material on the substrate can be reduced during applying the mold to the substrate.

In order to attain the aforementioned object, the present invention is directed to a pattern transfer apparatus, comprising: a conveyance device which conveys a substrate having a substrate surface; a liquid ejection device having a plurality of liquid ejection ports through which droplets of liquid are ejected and deposited onto the substrate surface while the liquid ejection device relatively moves to scan the substrate surface in a relative scanning direction; a stamp having a stamp surface on which a pattern is formed, the stamp surface being applied to the droplets of the liquid on the substrate surface in a stamp application direction while the stamp is relatively moved with respect to the substrate; and a curing device which cures the liquid on the substrate surface in a state where a whole of the stamp surface is in contact with the liquid on the substrate surface, wherein when defining, on the substrate surface, a plurality of strips which are straight and parallel to the stamp application direction and have widths substantially equal to diameters of the droplets deposited on the substrate surface, at least one of the strips includes the droplets which are ejected respectively from at least different two of the liquid ejection ports of the liquid ejection device.

According to this aspect of the present invention, even if there are variations between the liquid ejection ports when depositing the droplets of the liquid onto the substrate by the inkjet method, it is possible to reduce non-uniformity in the thickness of resulting film of the liquid during applying the stamp in the imprinting.

Preferably, the liquid ejection device deposits the droplets which are ejected respectively from at least different two of the liquid ejection ports onto a straight line which is defined on the substrate surface and parallel to the relative scanning direction.

Preferably, the liquid ejection device performs a plurality of relative scanning actions with respect to the substrate surface.

Preferably, the pattern transfer apparatus comprises a plurality of the liquid ejection devices.

Preferably, the relative scanning direction and the stamp application direction are not parallel to each other.

According to this aspect of the present invention, it is possible to make the droplets ejected from the different liquid ejection ports of the liquid ejection device present in at least two locations in the direction parallel to the stamp application direction, and it is then possible to more effectively reduce non-uniformity in the thickness of resulting film of the liquid during applying the stamp.

Preferably, the relative scanning direction and the stamp application direction are substantially perpendicular to each other.

According to this aspect of the present invention, it is possible to arrange the droplets ejected from all of the liquid ejection ports on at least one of the strips in the stamp application direction, and it is then possible to more effectively reduce non-uniformity in the thickness of resulting film of the liquid during applying the stamp.

Preferably, at least one of the strips includes the droplets which are ejected respectively from all of the liquid ejection ports of the liquid ejection device.

According to this aspect of the present invention, since the droplets ejected from all of the liquid ejection ports are present on at least one of the strips in the stamp application direction, then it is possible to more effectively reduce non-uniformity in the thickness of resulting film of the liquid during applying the stamp.

In order to attain the aforementioned object, the present invention is also directed to a method of forming a pattern on a substrate surface of a substrate by transferring a pattern formed on a stamp surface of a stamp to the substrate surface, the method comprising the steps of: ejecting and depositing droplets of liquid from a plurality of liquid ejection ports of a liquid ejection device onto the substrate surface while relatively moving the liquid ejection device to scan the substrate surface in a relative scanning direction; relatively moving the stamp with respect to the substrate to apply the stamp surface to the droplets of the liquid on the substrate surface in a stamp application direction; and curing the liquid on the substrate surface in a state where a whole of the stamp surface is in contact with the liquid on the substrate surface, and then removing the stamp surface from the cured liquid, wherein when defining, on the substrate surface, a plurality of strips which are straight and parallel to the stamp application direction and have widths substantially equal to diameters of the droplets deposited on the substrate surface, at least one of the strips includes the droplets which are ejected respectively from at least different two of the liquid ejection ports of the liquid ejection device.

According to this aspect of the present invention, even if there are variations between the liquid ejection ports when depositing the droplets of the liquid onto the substrate by the inkjet method, it is possible to reduce non-uniformity in the thickness of resulting film of the liquid during applying the stamp in the imprinting.

Preferably, in the ejecting and depositing step, the droplets which are ejected respectively from at least different two of the liquid ejection ports are deposited onto a straight line which is defined on the substrate surface and parallel to the relative scanning direction.

Preferably, in the ejecting and depositing step, a plurality of relative scanning actions are performed with respect to the substrate surface by the liquid ejection device.

Preferably, the ejecting and depositing step is performed with a plurality of the liquid ejection devices.

Preferably, the relative scanning direction and the stamp application direction are not parallel to each other.

According to this aspect of the present invention, it is possible to make the droplets ejected from the different liquid ejection ports of the liquid ejection device present in at least two locations in the direction parallel to the stamp application direction, and it is then possible to more effectively reduce non-uniformity in the thickness of resulting film of the liquid during applying the stamp.

Preferably, the relative scanning direction and the stamp application direction are substantially perpendicular to each other.

According to this aspect of the present invention, it is possible to arrange the droplets ejected from all of the liquid ejection ports on at least one of the strips in the stamp application direction, and it is then possible to more effectively reduce non-uniformity in the thickness of resulting film of the liquid during applying the stamp.

Preferably, at least one of the strips includes the droplets which are ejected respectively from all of the liquid ejection ports of the liquid ejection device.

According to this aspect of the present invention, since the droplets ejected from all of the liquid ejection ports are present on at least one of the strips in the stamp application direction, then it is possible to more effectively reduce non-uniformity in the thickness of resulting film of the liquid during applying the stamp.

As described above, according to the present invention, when depositing liquid of an imprint material onto a substrate by an inkjet method, even if there are variations between nozzles, non-uniformity in the film thickness of the imprint material on the substrate can be reduced during applying the mold to the substrate.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 5A is a plan diagram of a substrate and FIG. 5B is a front side diagram showing a state of application of a stamp;

DESCRIPTION OF THE PREFERRED EMBODIMENTS

Figure 1:
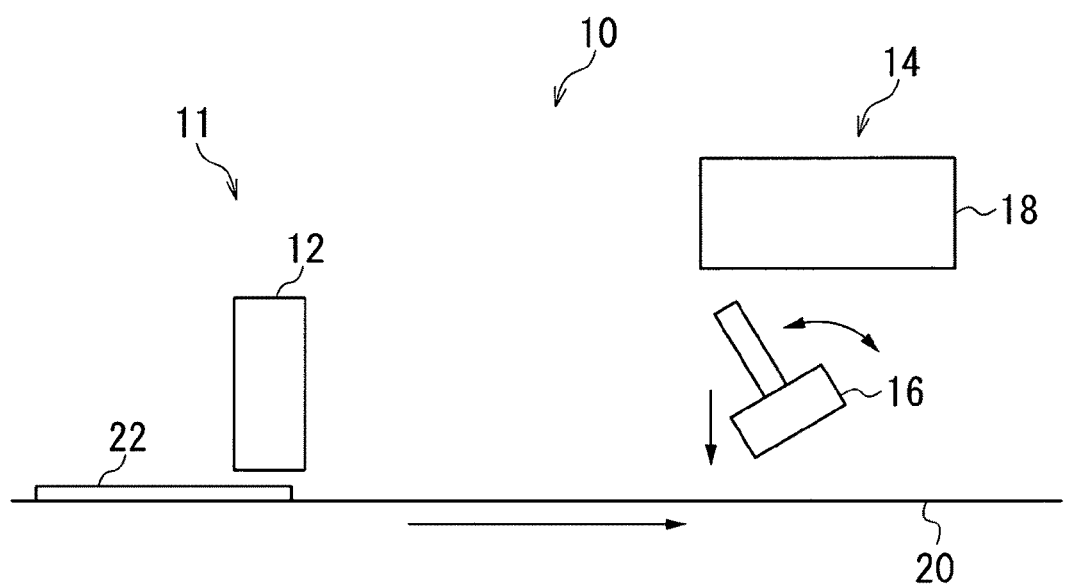
FIG. 1 is a general schematic drawing of a pattern transfer apparatus according to an embodiment of the present invention.

FIG. 1 is a general schematic drawing of a pattern transfer apparatus according to an embodiment of the present invention.

As shown in FIG. 1, the pattern transfer apparatus 10 in the present embodiment includes an inkjet liquid deposition unit 11 and a pattern forming unit 14. The inkjet liquid deposition unit 11 has an inkjet head (hereinafter referred to as a "recording head") 12. The pattern forming unit 14 includes a mold (stamp) 16 having a surface in which a topographic pattern is formed, and an ultraviolet (UV) light irradiation device 18.

The recording head 12 deposits liquid of an imprint material on the surface of a substrate 22 by ejecting and depositing droplets of the liquid imprint material onto the surface of the substrate 22 which is conveyed on a conveyance device 20.

The substrate 22 on which the droplets of the liquid imprint material have been deposited is conveyed by the conveyance device 20 to the pattern forming unit 14, and a pattern is formed on the substrate 22 in the pattern forming unit 14. More specifically, the stamp 16 is pressed against the droplets of the liquid imprint material deposited on the substrate 22, UV light is irradiated by the UV light irradiation device 18 to cure the liquid, and the stamp 16 is then removed from the substrate 22 or the cured imprint material, thereby forming the pattern on the substrate 22.

In this process, the stamp 16 is moved downward and rotated so as to be pressed against the liquid imprint material on the surface of the substrate 22, from one end of the stamp 16 as indicated with a double-headed arrow in FIG. 1. These actions are described in detail later.

Figure 2A:
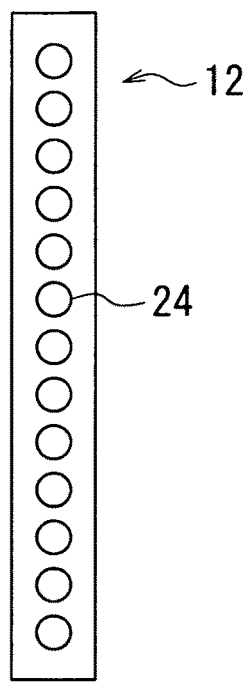
FIG. 2A is a plan diagram of a recording head.
Figure 2B:
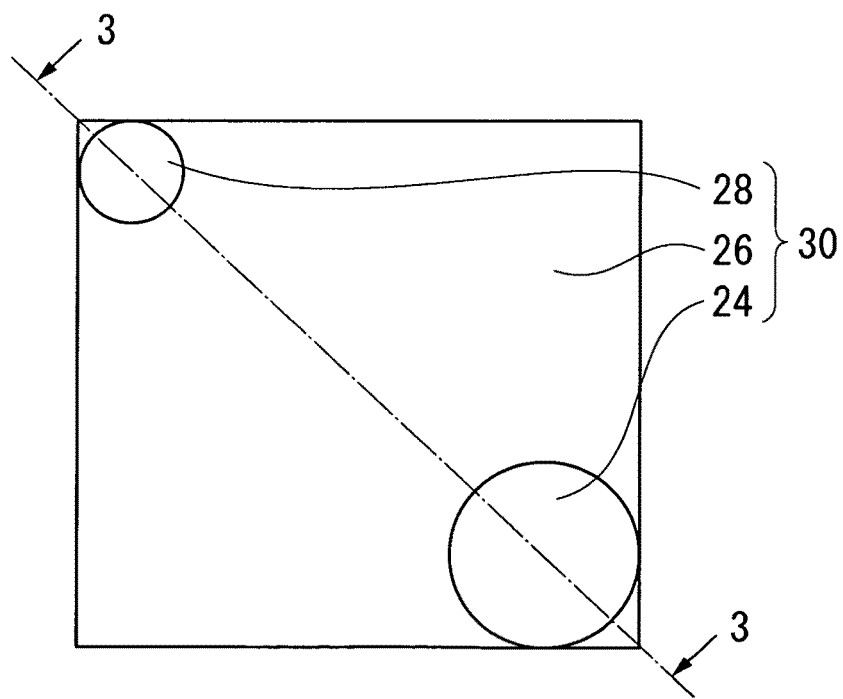
FIG. 2B is a plan view perspective diagram of an ejection element.

FIG. 2A shows a plan diagram of the recording head 12, and FIG. 2B shows a perspective view plan diagram of an ejection element including one nozzle.

As shown in FIG. 2A, in the recording head 12 in the present embodiment, the nozzles 24 which eject droplets of the liquid imprint material are arranged at uniform intervals in a single row.

As shown in FIG. 2B, each nozzle 24 is included in an ejection element 30, which has: a pressure chamber 26, which applies pressure for ejecting a droplet of the liquid; and a liquid supply port 28, through which the liquid to be ejected is supplied from a common flow channel 32 (shown in FIG. 3) to the pressure chamber 26.

As shown in FIG. 2B, the pressure chamber 26 has a substantially square shape in plan view, the nozzle 24 is arranged in one end of the diagonal thereof, and the liquid supply port 28 is arranged in the other end thereof. The planar shape of the pressure chamber 26 may be one of various different shapes apart from the square shape described above, for example, a quadrilateral shape, such as a rhombus or rectangular shape, a pentagonal, a hexagonal, or other polygonal shapes, a circular shape, an elliptical shape, or the like. In cases where the planar shape of the pressure chamber 26 is other than the square shape, it is also desirable to dispose the nozzle 24 and the liquid supply port 28 at the greatest possible mutual separation in the planar shape.

Figure 3:
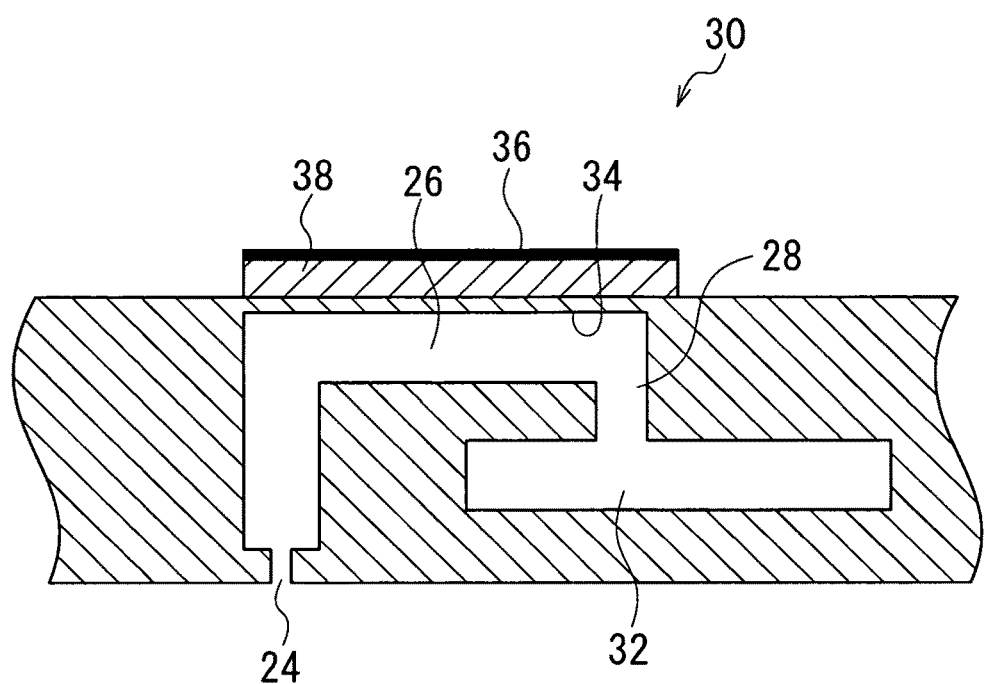
FIG. 3 is a cross-sectional diagram of the ejection element along line 3-3 in FIG. 2B.

FIG. 3 is a cross-sectional diagram of the ejection element 30 along line 3-3 in FIG. 2B.

As shown in FIG. 3, the pressure chamber 26 of the ejection element 30 is connected through the liquid supply port 28 to the common flow channel 32. The common flow channel 32 is connected to a tank (not shown) which forms a liquid supply source, and the liquid supplied from the tank is distributed to the respective pressure chambers 26 through the common flow channel 32.

A piezoelectric element 38 provided with an individual electrode 36 is bonded to a pressure plate (a diaphragm that also serves as a common electrode) 34, which forms a face (in FIG. 3, the ceiling) of the pressure chambers 26. For the material of the piezoelectric element 38, it is possible to use a piezoelectric body, such as lead zirconate titanate (PZT) or barium titanate, for example.

When a drive signal is applied between the individual electrode 36 and the common electrode 34 (which also serves as the pressure plate), the piezoelectric element 38 deforms and the volume of the pressure chamber 26 changes. Thereby, the pressure inside the pressure chamber 26 changes, and a droplet of the liquid is ejected from the nozzle 24. Furthermore, when the displacement of the piezoelectric element 38 reverts to the original shape after ejecting the droplet, new liquid is replenished to the pressure chamber 26 from the common flow channel 32 through the liquid supply port 28.

In the present embodiment, a method is employed which applies pressure to the liquid in the pressure chamber 26 by deformation of the piezoelectric element 38; however, it is also possible to use an actuator based on another method (for example, a thermal method).

Figure 4:
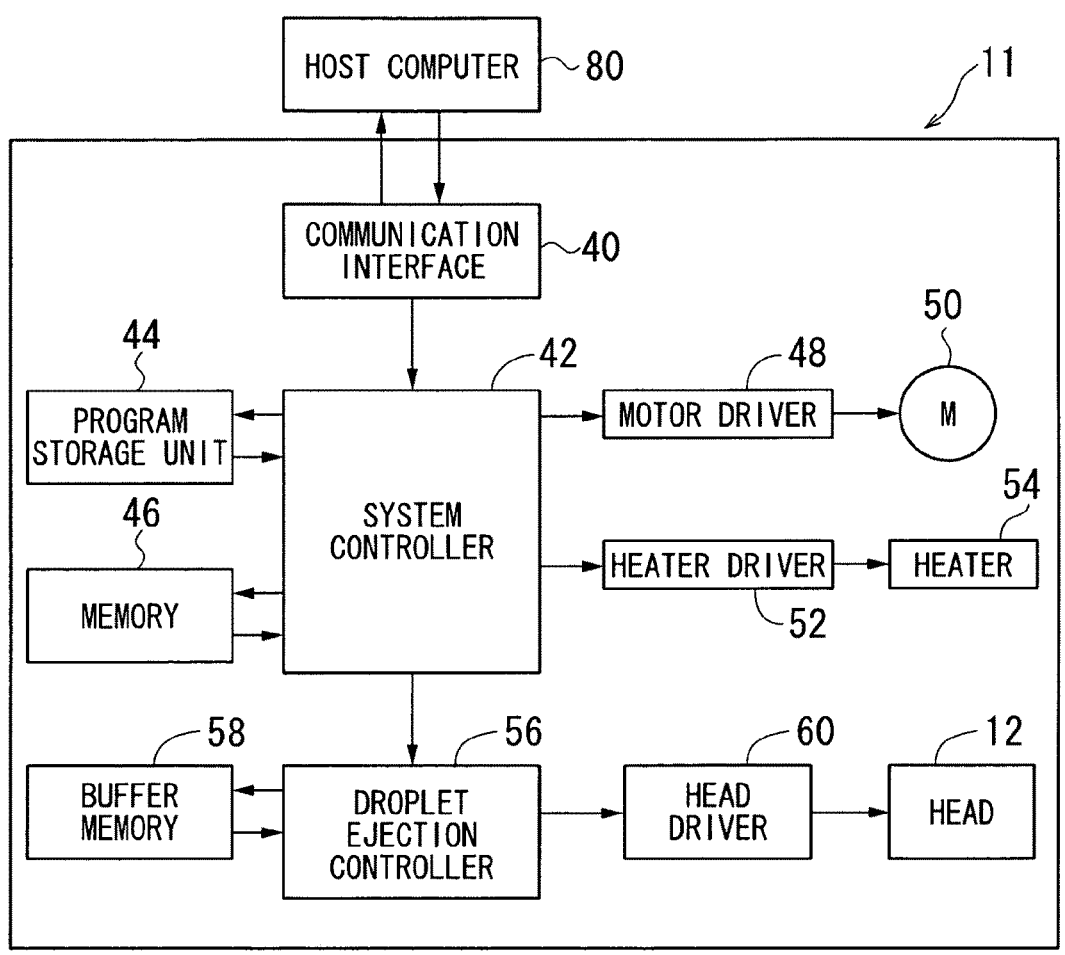
FIG. 4 is a block diagram showing the control system of an inkjet liquid deposition unit in the pattern transfer apparatus.

FIG. 4 is a block diagram showing the control system of the inkjet liquid deposition unit 11 in the pattern transfer apparatus 10.

The inkjet liquid deposition unit 11 includes a communication interface 40, a system controller 42, a memory 46, a motor driver 48, a heater driver 52, a droplet ejection controller 56, a buffer memory 58, and a head driver 60.

The communication interface 40 is an interface unit for receiving droplet ejection data transmitted from a host computer 80. For the communication interface 40, a serial interface, such as USB (Universal Serial Bus), IEEE 1394, an Ethernet, or a wireless network, or the like, or a parallel interface, such as a Centronics interface, or the like, can be used. It is also possible to install a buffer memory in the communication interface 40 for achieving high-speed communications.

The system controller 42 includes a central processing unit (CPU) and peripheral circuits thereof, and forms a control unit that controls the respective units of the inkjet liquid deposition unit 11. The system controller 42 controls communications with the host computer 80 and the reading and writing from and to the memory 46, and the like, as well as generating control signals which control a motor 50 and a heater 54 in a conveyance drive system including the conveyance device 20.

A control program for the inkjet liquid deposition unit 11 is stored in the program storage unit 44. The system controller 42 reads out various control programs stored in the program storage unit 44, as appropriate, and executes the control programs.

The memory 46 is a storage device which includes a temporary storage area for data and a work area for the system controller 42 to carry out calculations. Apart from a memory composed of semiconductor devices, it is also possible to use for the memory 46 a magnetic medium, such as a hard disk.

The motor 50 drives the conveyance drive system including the conveyance device 20 shown in FIG. 1 for moving the recording head 12 and the substrate 22 relatively to each other. The motor driver 48 drives the motor 50 in accordance with a control signal from the system controller 42. Instead of fixing the recording head 12 and moving the substrate 22 by means of the conveyance device 20 as shown in FIG. 1, it is also possible temporarily to halt the substrate 22 in a position below the recording head 12, and to move the recording head 12 for relatively scanning the substrate 22.

The heater driver 52 drives the heater 54 in accordance with a control signal from the system controller 42. The heater 54 includes temperature adjustment heaters arranged in respective sections of the inkjet liquid deposition unit 11.

Droplet ejection data sent from the host computer 80 is read into the inkjet liquid deposition unit 11 through the communication interface 40, and is stored temporarily in the memory 46.

The droplet ejection controller 56 is a control unit which has signal processing functions for carrying out processing, correction, and other treatments in order to generate an ejection control signal from the droplet ejection data in the memory 46 in accordance with the control of the system controller 42, and which supplies the ejection control signal (ejection data) thus generated to the head driver 60. In the droplet ejection controller 56, various signal processing is carried out and the ejection volume and the ejection timing of the recording head 12 are controlled through the head driver 60 on the basis of the droplet ejection data.

The head driver 60 drives the piezoelectric elements 38 of the recording head 12 on the basis of the ejection data supplied from the droplet ejection controller 56. The head driver 60 may include a feedback control system for maintaining uniform drive conditions in the recording head 12.

The buffer memory 58 is connected to the droplet ejection controller 56, and data, such as droplet ejection data and parameters, is stored temporarily in the buffer memory 58 when processing the droplet ejection data in the droplet ejection controller 56.

The buffer memory 58 may also serve as the memory 46. Also possible is a mode in which the droplet ejection controller 56 and the system controller 42 are integrated to form a single processor.

Although not shown in the drawings, the inkjet liquid deposition unit 11 also includes a supply system for supplying the liquid to the recording head 12 and a maintenance mechanism which carries out maintenance of the recording head 12.

Figure 5A:
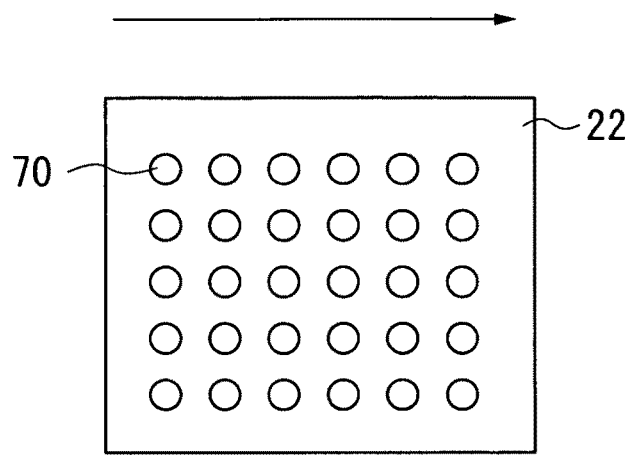
FIGS. 5A and 5B are conceptual views of a pattern forming method in the present embodiment, where
Figure 5B:
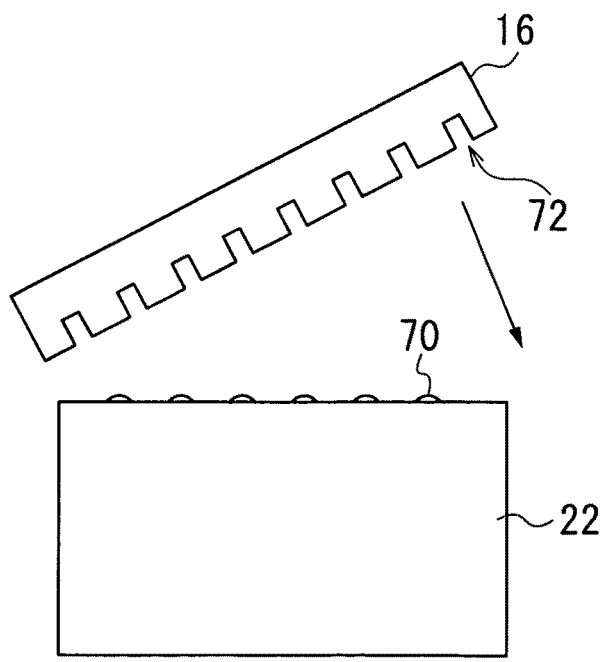

FIGS. 5A and 5B show conceptual views of a pattern forming method according to an imprint method in the present embodiment.

FIG. 5A is a plan diagram showing the substrate 22 having the surface on which the droplets of the liquid imprint material 70 have been deposited. FIG. 5B is a front view diagram showing an aspect of the stamp 16 being applied onto the substrate 22 (i.e., the droplets of the liquid imprint material 70 on the substrate 22). In FIGS. 5A and 5B, the arrows indicate the direction in which the stamp 16 is progressively applied onto the substrate 22. In FIG. 5B, recesses 72 formed on the stamp 16 are depicted in highly exaggerated fashion in order to make the illustration easier to understand, and hence the depiction considerably differs from the actual dimensions.

As shown in FIG. 5A, the droplets of the liquid imprint material 70 have been sparsely distributed at prescribed intervals on the surface of the substrate 22. As shown in FIG. 5B, the stamp 16 is obliquely positioned to the substrate 22 and then applied to the substrate 22 from one end by rotation as indicated with the arrow in FIG. 5B, whereby the liquid imprint material 70 enters into the recesses 72 in the stamp 16.

While the application of the stamp 16, a part of the liquid imprint material 70 that has not entered in the recesses 72 is gradually pushed and spread in the rightward direction in FIG. 5B due to the movement of the stamp 16, and progressively fills into the recesses 72. Since the stamp 16 is thus obliquely applied onto the substrate 22 from one end, air bubbles in the liquid imprint material 70 are able to escape toward the right-hand side which is open to the air, and the filling properties do not deteriorate.

Below, the method of depositing the droplets of the liquid imprint material to the substrate according to the present invention is described.

Firstly, the principles of the present invention are described with respect to a highly simplified embodiment.

Figure 6:
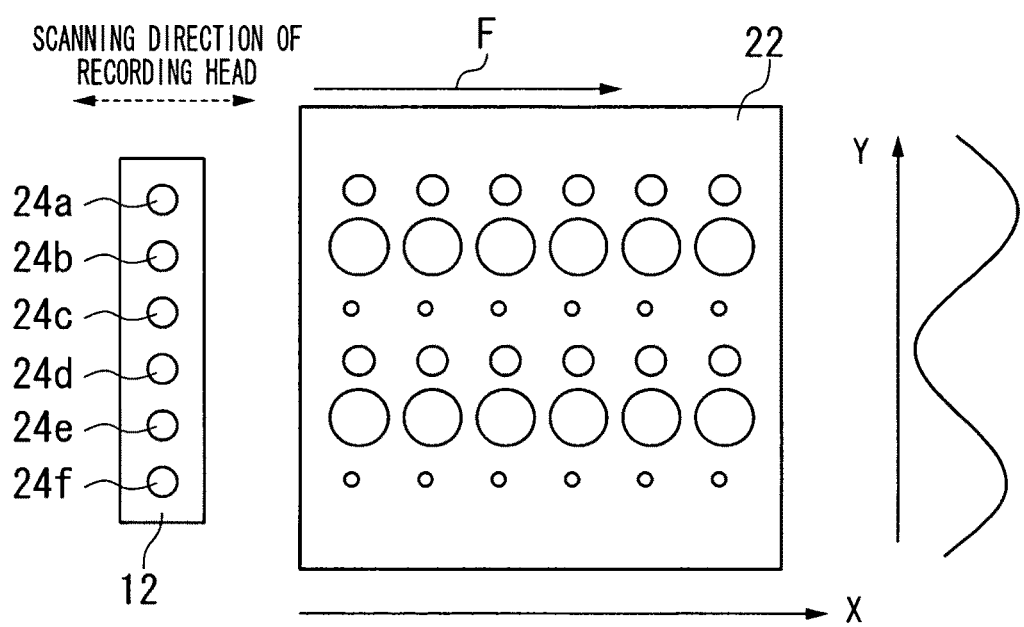
FIG. 6 is an illustrative diagram showing a case where the main scanning direction is parallel to the stamp application direction.

The recording head 12 shown in FIG. 6 has six nozzles 24a, 24b, 24c, 24d, 24e and 24f. Here, suppose that there is variation in the sizes of the droplets of the liquid imprint material ejected from the respective nozzles. For example, the droplets ejected from the nozzles 24a and 24d are the standard size, but the droplets ejected from the nozzles 24b and 24e are larger than the standard size, and the droplets ejected from the nozzles 24c and 24f are smaller than the standard size. In FIG. 6, for the purposes of description, the droplets are depicted in highly exaggerated sizes and variations compared to their actual sizes and variations.

As shown in FIG. 6, taking the application direction of the stamp 16 indicated with an arrow F (the stamp 16 is not shown in FIG. 6) as the X axis, and taking the direction perpendicular to this as the Y axis, the lengthwise direction of the recording head 12 (i.e., the arrangement direction of the nozzles 24) is set to be substantially parallel to the Y axis, and the recording head 12 is relatively moved to scan the substrate 22 in the direction parallel to the stamp application direction F. Thereby, the droplets of the liquid imprint material having the various sizes corresponding to the variations in the respective nozzles are deposited on the substrate 22 so as to form rows in the direction parallel to the stamp application direction F.

In this case, as shown in FIG. 6, the droplets of the same size are aligned in each row parallel to the stamp application direction F at each position in the Y direction. Then, by applying the stamp 16 in the direction F, the droplets of the large size are merged with the droplets of the large size, and the droplets of the small size are merged with the droplets of the small size. Thereby, non-uniformity occurs in the thickness of resulting film of the liquid imprint material as indicated with film thickness distribution shown on the right-hand side of the Y axis in FIG. 6.

Figure 7:
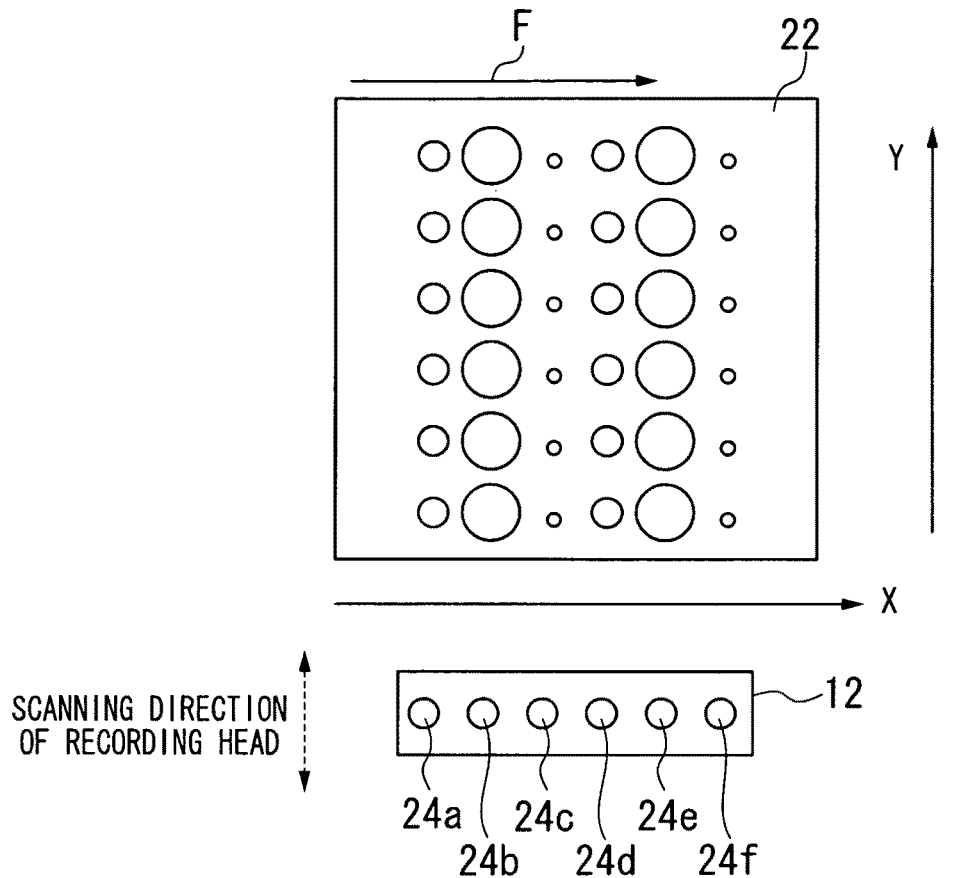
FIG. 7 is an illustrative diagram showing a case where the main scanning direction is perpendicular to the stamp application direction.

On the other hand, in FIG. 7, the recording head 12 is arranged so that the lengthwise direction thereof is substantially parallel to the X axis, and the recording head 12 is relatively moved to scan the substrate 22 in a direction that is substantially perpendicular to the stamp application direction F and is substantially parallel to the Y axis. Thereby, the droplets of the liquid imprint material having the various sizes corresponding to the variations in the respective nozzles are deposited on the substrate 22 so as to form columns in the direction perpendicular to the stamp application direction F.

In this case, as shown in FIG. 7, the droplets of the same size are aligned in each column perpendicular to the stamp application direction F at each position in the X direction, and the droplets of the various sizes are aligned in each row parallel to the stamp application direction F at each position in the Y direction. Then, by applying the stamp 16 in the direction F, the droplets of the various sizes are merged together and averaged. Thereby, the film thickness distribution in the Y direction is made substantially uniform as shown on the right-hand side of the Y axis in FIG. 7.

Thus, by depositing the droplets of various sizes, which correspond to the variations in the nozzles, in the direction parallel to the application direction F of the stamp 16, the film thickness distribution after the application of the stamp 16 is smoothed. In other words, it is possible to reduce non-uniformity in the thickness of resulting film of the liquid imprint material by depositing droplets of the liquid imprint material along the stamp application direction F from various nozzles in the inkjet head.

Specific embodiments are described below.

Figure 8:
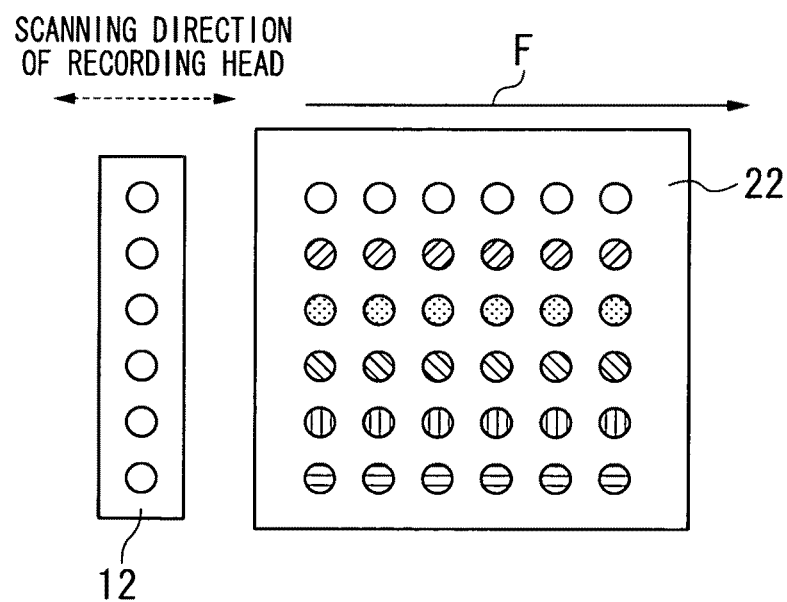
FIG. 8 is an illustrative diagram showing a case where the main scanning direction is parallel to the stamp application direction.

In the example shown in FIG. 8, the recording head 12 is arranged so that the lengthwise direction thereof is substantially perpendicular to the stamp application direction F, and the recording head 12 is relatively moved to scan the substrate 22 in the direction parallel to the stamp application direction F. In this case, each row that is constituted of droplets of the same size is arranged in the direction parallel to the stamp application direction F. Consequently, if there is variation in the respective nozzles of the recording head 12, then non-uniformity occurs in the film thickness distribution in the direction perpendicular to the stamp application direction F after the application of the stamp as illustrated in FIG. 6. Therefore, it is not desirable to deposit the droplets of the liquid imprint material by relatively moving the recording head 12 to scan the substrate 22 in the direction parallel to the stamp application direction F as shown in FIG. 8.

Figure 9:
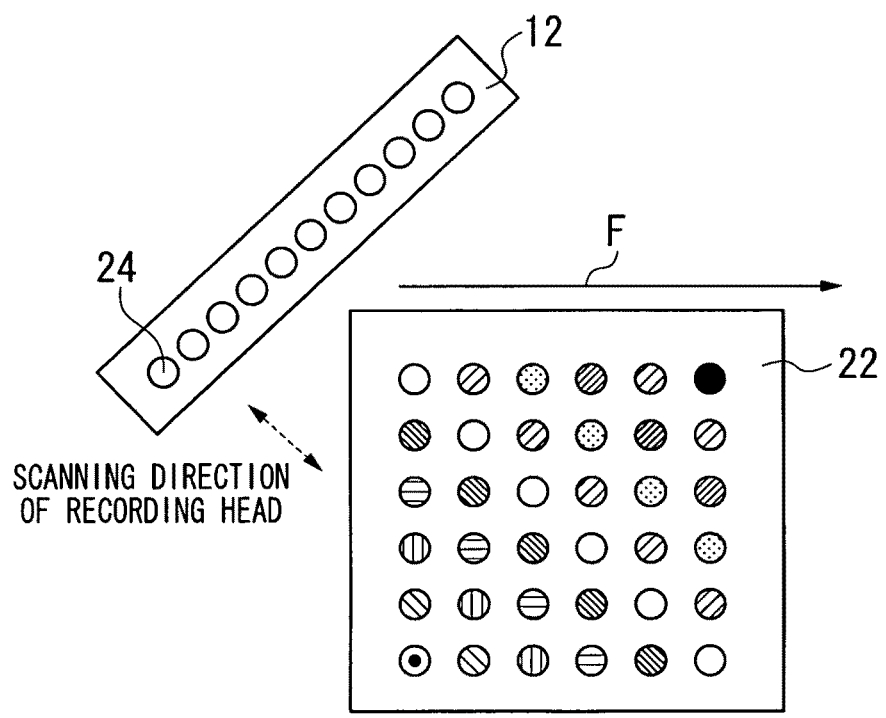
FIG. 9 is an illustrative diagram showing a case where the main scanning direction forms an angle of 45° with the stamp application direction.

In the example shown in FIG. 9, the direction in which the recording head 12 is relatively moved to scan the substrate 22 is set to an oblique direction forming an angle of θ, where 0°<θ<90° (for example, θ=45°), with respect to the stamp application direction F, and the recording head 12 then performs an oblique scanning with respect to the substrate 22. In this case, as shown in FIG. 9, the droplets of the same size which are ejected from the same nozzle 24 are aligned in each column oblique to the stamp application direction F on the substrate 22, and the droplets which are ejected from different nozzles 24 are aligned in each row parallel to the stamp application direction F on the substrate 22. Hence, even if there is variation between the nozzles 24, since the droplets of various sizes are arranged in each row parallel to the stamp application direction F, then there is no occurrence of non-uniformity in the film thickness distribution after the application of the stamp.

Figure 10:
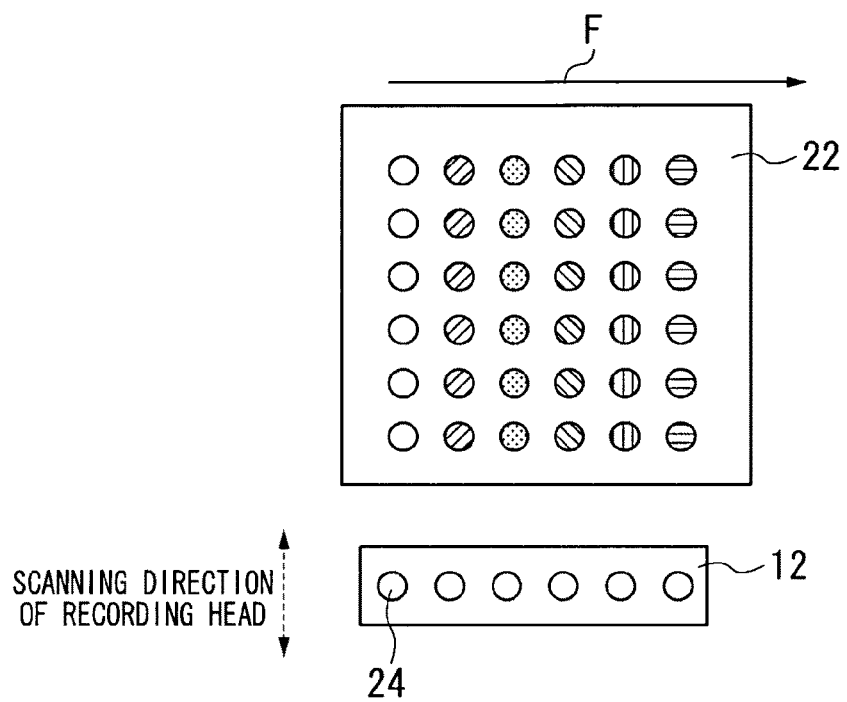
FIG. 10 is an illustrative diagram showing a case where the main scanning direction is perpendicular to the stamp application direction.

In the example shown in FIG. 10, the direction in which the recording head 12 is relatively moved to scan the substrate 22 is set to the direction substantially perpendicular to the stamp application direction F, and the droplets of the same size which are ejected from the same nozzle 24 are aligned in each column perpendicular to the stamp application direction F on the substrate 22. In this case also, since the droplets which are ejected from different nozzles 24 are aligned in each row parallel to the stamp application direction F, then there is no occurrence of non-uniformity in the film thickness distribution after the application of the stamp.

Consequently, in view of reducing non-uniformity in the thickness of resulting film of the liquid imprint material, it is desirable that the scanning direction of the recording head 12 is oblique (for example, at 45°) or perpendicular to the stamp application direction F, as shown in FIGS. 9 and 10.

Next, a case of shuttle (serial) scanning where the recording head 12 scans the substrate 22 a plurality of times is described.

Figure 11:
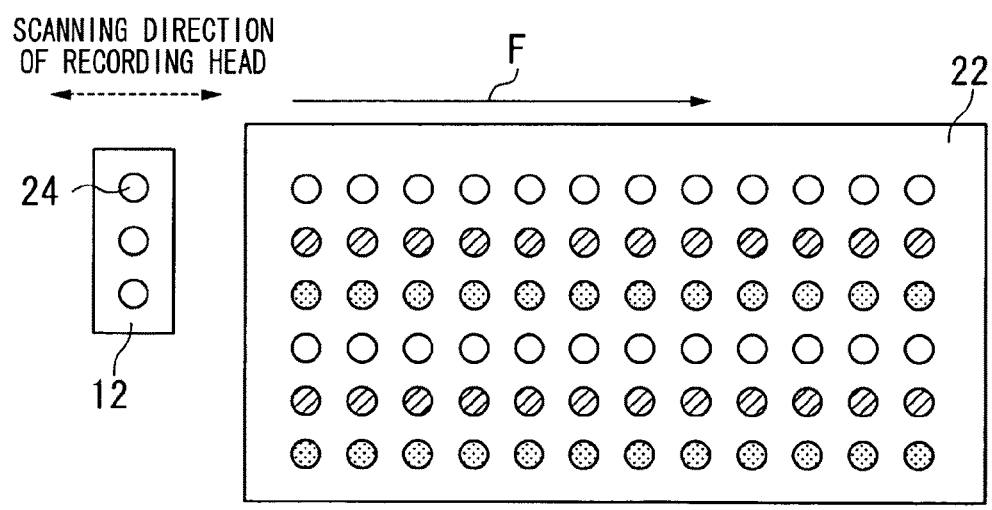
FIG. 11 is an illustrative diagram showing a case where the main scanning direction is parallel to the stamp application direction, in shuttle scanning.

Firstly, in the shuttle scanning, a case is considered in which the recording head 12 is relatively moved to scan the substrate 22 in the direction parallel to the stamp application direction F as shown in FIG. 11. In the example shown in FIG. 11, the recording head 12 has three nozzles 24, and droplets are deposited at first to form three upper rows on the substrate 22 parallel to the stamp application direction F, whereupon droplets are deposited to form three lower rows by shuttle scanning. Thereby, each row of the droplets of the same size is formed in the direction parallel to the stamp application direction F, as shown in FIG. 11.

Consequently, in this case, since the droplets of the same size are merged together when the stamp is applied in the direction F, then if there is variation in the nozzles 24, non-uniformity occurs in the film thickness distribution following the direction perpendicular to the stamp application direction F after the application of the stamp. Therefore, the droplet deposition method such as that shown in FIG. 11 is not desirable from the viewpoint of reducing non-uniformity in the thickness of resulting film of the liquid imprint material.

Figure 12:
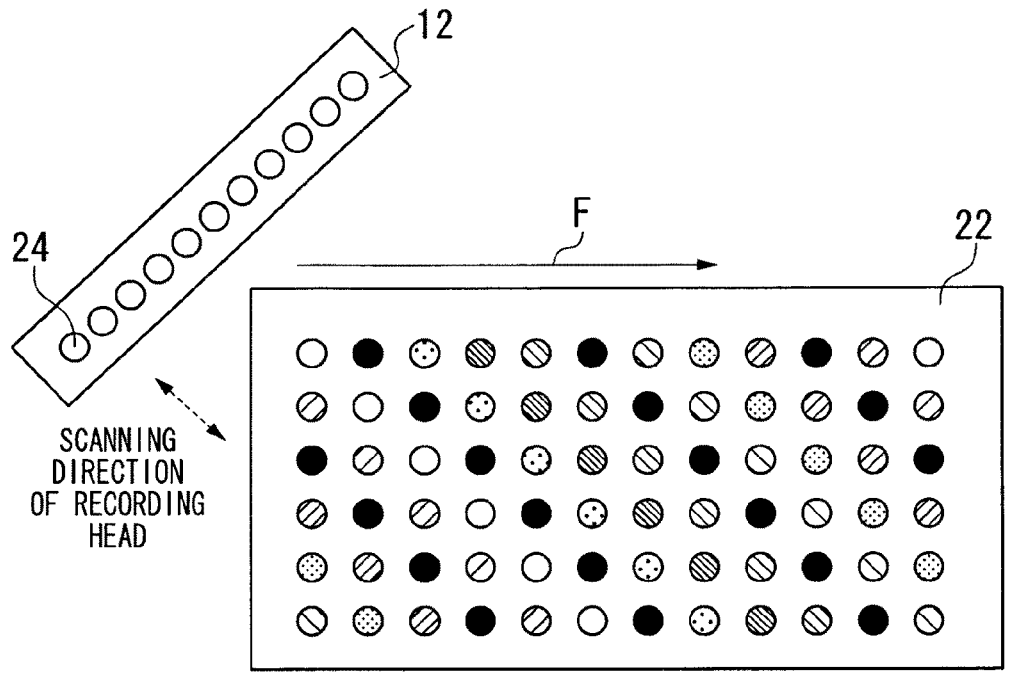
FIG. 12 is an illustrative diagram showing a case where the main scanning direction forms an angle of 45° with the stamp application direction, in shuttle scanning.

Next, a case is considered in which, as shown in FIG. 12, the recording head 12 is relatively moved to scan the substrate 22 in a direction oblique to the stamp application direction F at an angle of θ, where 0°<θ<90° (for example, θ=45°). In this case, the droplet deposition is carried out over an imprinting region on the substrate 22 by scanning the substrate 22 a plurality of times while relatively moving the recording head 12 in the lengthwise direction thereof. Thereby, as shown in FIG. 12, the droplets of the same size ejected from the same nozzle 24 are arranged in each column oblique to the stamp application direction F on the substrate 22, and the droplets ejected from different nozzles 24 are arranged in each row parallel to the stamp application direction F on the substrate 22. Therefore, since the droplets ejected from the different nozzles 24 are arranged in each row parallel to the stamp application direction F, even if there is variation between the nozzles 24, the droplets of various sizes are merged together and the film thickness distribution is smoothed when the stamp is applied, and non-uniformity is thus reduced in the thickness of resulting film of the liquid imprint material.

Figure 13:
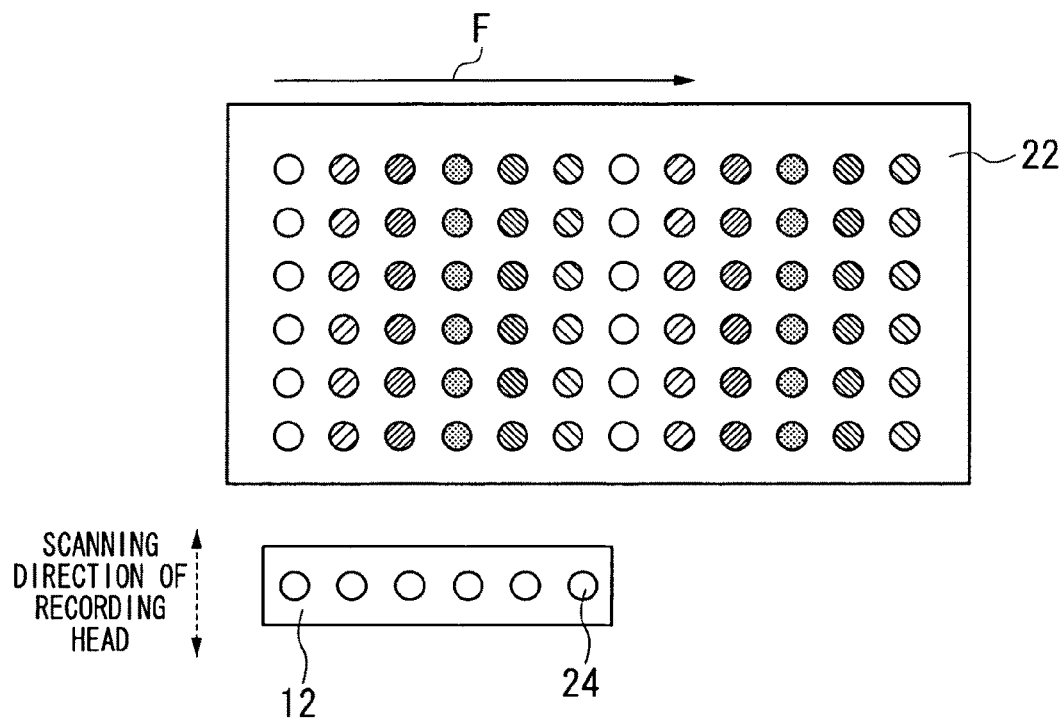
FIG. 13 is an illustrative diagram showing a case where the main scanning direction is perpendicular to the stamp application direction, in shuttle scanning.

Another case is considered in which, as shown in FIG. 13, the recording head 12 is relatively moved to scan the substrate 22 in the direction substantially perpendicular to the stamp application direction F. In the example shown in FIG. 13, the droplet deposition is carried out by scanning the substrate 22 twice in the direction perpendicular to the stamp application direction F with the recording head 12 having six nozzles 24 while relatively moving the recording head 12 in the lengthwise direction thereof. In this case, the droplets of the same size which are ejected from the same nozzle 24 are arranged in each column perpendicular to the stamp application direction F, and the droplets ejected from different nozzles 24 are arranged in each row parallel to the stamp application direction F.

Consequently, in this case also, even if there is variation between the nozzles 24, the droplets of various sizes are merged together by the application of the stamp, and the occurrence of non-uniformity in the thickness of resulting film of the liquid imprint material is reduced in the direction perpendicular to the stamp application direction F.

As described above, when liquid of an imprint material is deposited onto a substrate in is the present embodiment, droplets of the liquid are ejected and deposited to the substrate by an inkjet method. In this case, the direction in which the inkjet head (recording head) is relatively moved with respect to the substrate is taken as the main scanning direction. When a stamp in which a pattern is formed is applied onto the imprint material on the substrate during imprinting, the stamp is applied in a stamp application direction from one end of the stamp toward the other end thereof. Here, the main scanning direction is set to be non-parallel to the stamp application direction in such a manner that when defining, on the substrate surface, a plurality of strips which are straight and parallel to the stamp application direction and have widths substantially equal to diameters of the droplets deposited on the substrate surface, at least one of the strips includes the droplets which are ejected respectively from at least different two of the nozzles of the recording head. Thus, by mixing the droplets deposited by the different nozzles in the stamp application direction, even if there is variation between the nozzles, the droplets of various sizes are merged together and averaged by the application of the stamp, and non-uniformity of the film thickness distribution in the direction perpendicular to the stamp application direction can be reduced.

Generally, in order to reduce effects of variation between nozzles, it is desirable that droplets deposited on the strips parallel to the stamp application direction are ejected from a greater number of nozzles. Moreover, most desirably, the droplets ejected from all of the nozzles used are arranged on the strips parallel to the stamp application direction. Thereby, when the droplets are spread by the stamp application, the variation between the nozzles is smoothed.

Moreover, the droplets can be spread more uniformly upon the stamp application when the droplet volume is uniform in the portions which are simultaneously applied with the stamp. Hence, the angle between the stamp application direction and the main scanning direction is desirably close to 90°, and is more desirably the right angle.

The droplet deposition patterns according to the present embodiment have been described with reference to FIGS. 9, 10, 12 and 13, but the droplet deposition pattern is not limited to these, and other droplet deposition patterns such as those shown in FIGS. 14 to 19 can also be adopted.

The droplet deposition patterns shown in FIGS. 14 to 19 are formed by relatively moving the recording head 12 (not shown in these drawings) in the horizontal directions in the drawings over the substrate 22. In FIGS. 14 to 19, the number inside each of circles representing droplets deposited on the substrate 22 denotes the number of relative scan of the recording head 12 with respect to the substrate 22 in which the droplet has been ejected, or the head number from which the droplet has been ejected in the case where a plurality of recording heads 12 are used, and the letter A, B, C, . . . inside each of the circles denotes a particular nozzle in the recording head 12 from which the droplet has been ejected. That is, the deposited droplets denoted with the same letter and number are the droplets ejected from the same nozzle.

Figure 14:
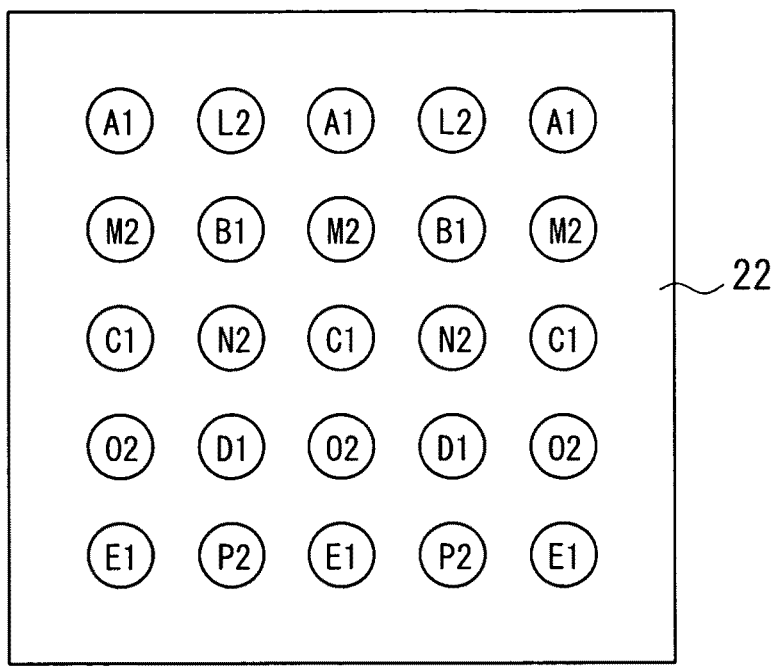
FIG. 14 is an illustrative diagram showing another droplet deposition pattern in the present embodiment.
Figure 15:
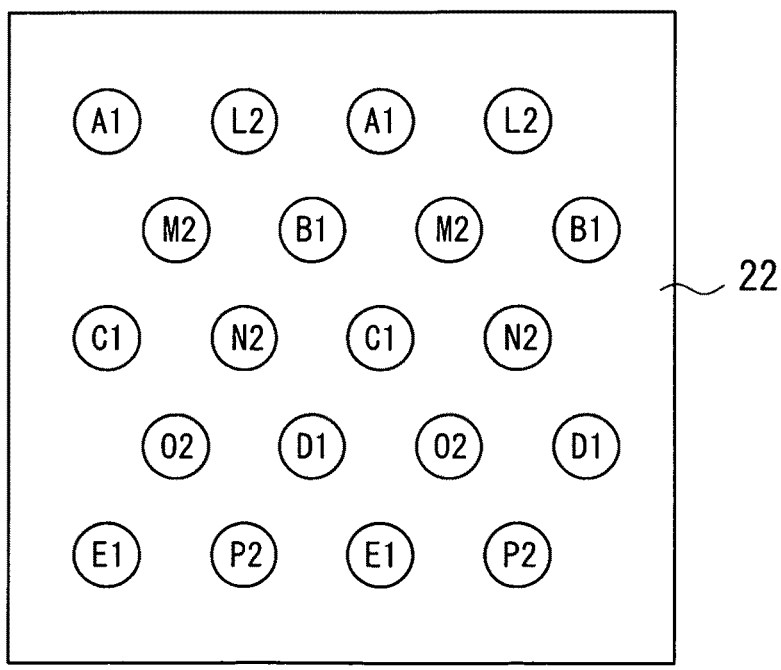
FIG. 15 is an illustrative diagram showing another droplet deposition pattern in the present embodiment.
Figure 16:
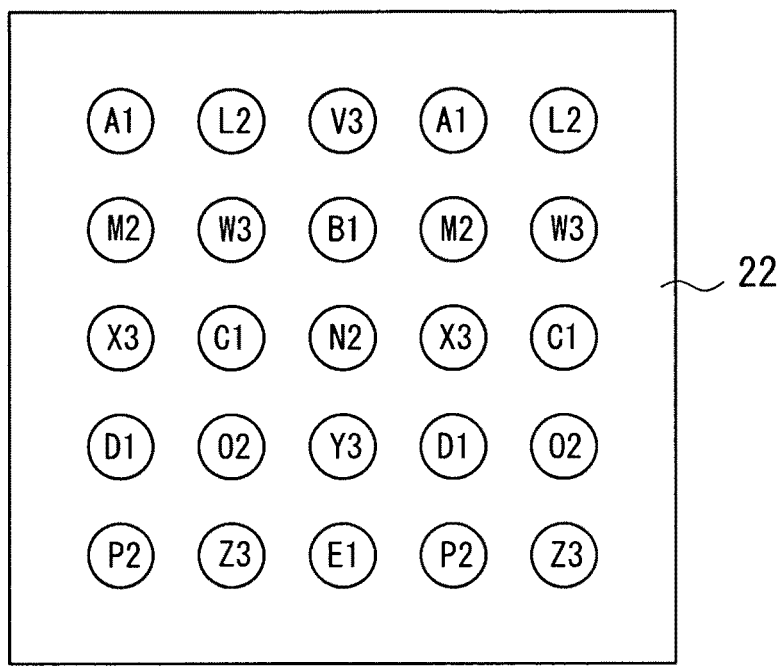
FIG. 16 is an illustrative diagram showing another droplet deposition pattern in the present embodiment.
Figure 17:
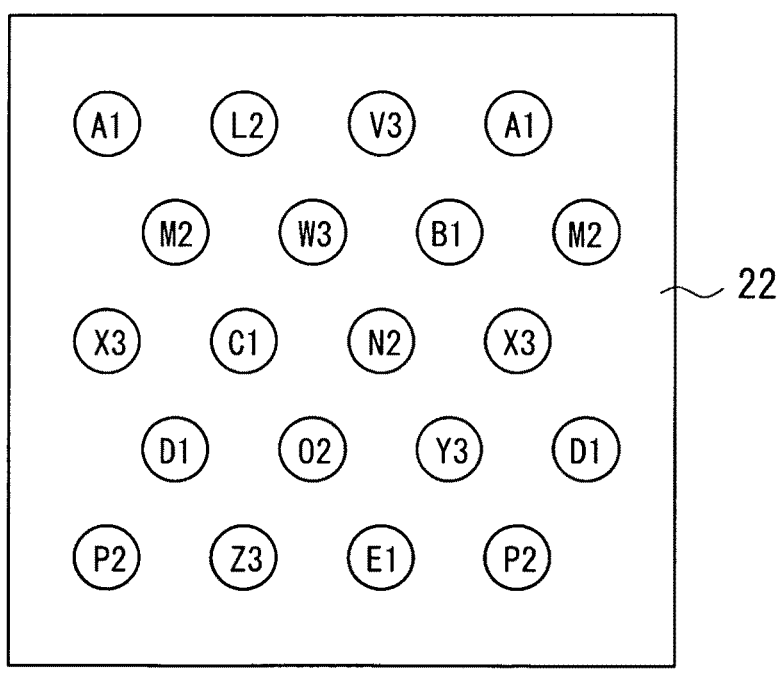
FIG. 17 is an illustrative diagram showing another droplet deposition pattern in the present embodiment.
Figure 18:
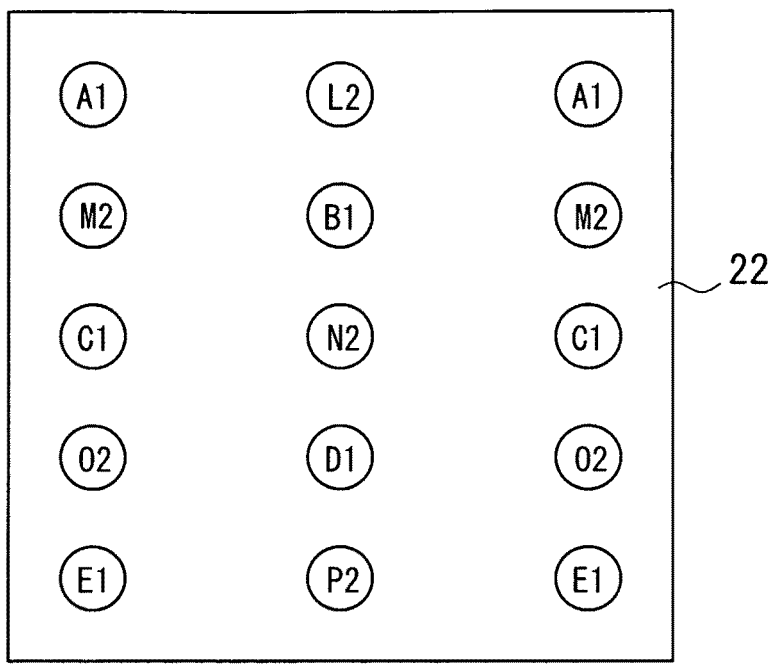
FIG. 18 is an illustrative diagram showing another droplet deposition pattern in the present embodiment.
Figure 19:
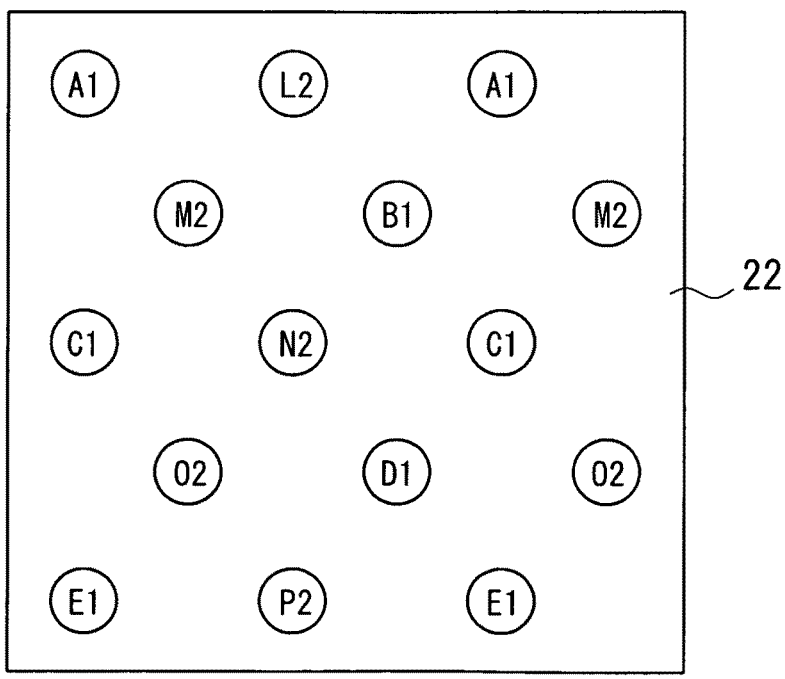
FIG. 19 is an illustrative diagram showing another droplet deposition pattern in the present embodiment.

It is possible that the droplet deposition positions are located at the same positions in the respective rows as in FIGS. 14, 16 and 18, or the droplet deposition positions are staggered between the respective rows as in FIGS. 15, 17 and 19.

FIGS. 14 to 17 show examples in which the droplet deposition intervals are the same in the row direction and the column direction, and FIGS. 18 and 19 show examples in which the droplet deposition interval is longer in the row direction than that in the column direction.

The droplet arrangements are not limited to these, and can be appropriately designed in accordance with the mold patterns, or the like.

Moreover, FIGS. 14, 15, 18 and 19 show examples in which two scanning actions or two recording heads are used to form each row, and FIGS. 16 and 17 show examples in which three scanning actions or three recording heads are used to form each row. The number of scanning actions and the number of recording heads are not limited to these, and furthermore, a combination of some scanning actions and some recording heads can also be employed.

In any of the examples shown in FIGS. 14 to 19, when the stamp application direction is any of the vertical direction, the horizontal direction and the oblique direction in the drawings, a plurality of deposited droplets ejected from different nozzles are included in each of straight strips parallel to the stamp application direction. In order to include droplets ejected from a greater number of different nozzles in each straight strip parallel to the stamp application direction, it is especially desirable that the stamp application direction is the vertical direction or the oblique direction in the drawings.

Figure 20:
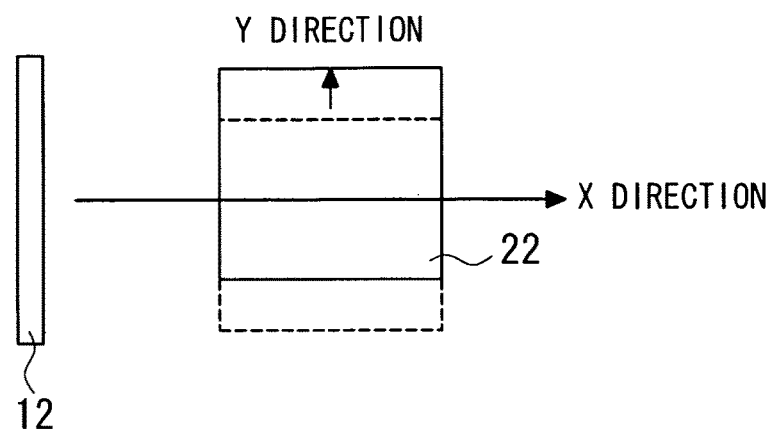
FIG. 20 is a schematic drawing of an apparatus composition for achieving the droplet deposition pattern in the present embodiment.

FIG. 20 is a schematic drawing of an apparatus composition for achieving a droplet deposition pattern of this kind. In the embodiment shown in FIG. 20, a droplet deposition pattern is formed on the substrate 22 by repeating an operation of depositing droplets while moving one recording head 12 and a substrate 22 relatively in the X direction, moving the substrate 22 or the recording head 12 in the Y direction perpendicular to the X direction, and then depositing droplets while moving the recording head 12 and the substrate 22 relatively in the X direction. In this case, the recording head 12 performs a plurality of scans (relative scanning actions) with respect to the substrate 22.

It is also possible to prepare a plurality of recording heads and reduce the number of relative movement actions, rather than using the single recording head 12 to scan the substrate a plurality of times. In another apparatus composition shown in FIG. 21, two recording heads 12a and 12b are prepared in respect of a substrate 22. Each of the recording heads 12a and 12b has a larger droplet ejection width than the width of the droplet deposition region on the substrate 22. The two recording heads 12a and 12b perform droplet ejection while moving in the X direction relatively to the substrate 22. In this embodiment, there is no need to move the substrate 22 relatively in the Y direction perpendicular to the X direction as in the embodiment shown in FIG. 20.

If the droplet ejection width of the recording heads 12a and 12b is smaller than the width of the droplet deposition region on the substrate 22, then in order to deposit droplets on the whole of the droplet deposition region, it is necessary to perform a plurality of scans by moving the recording heads 12a and 12b or the substrate 22 relatively in the Y direction.

Figure 21:
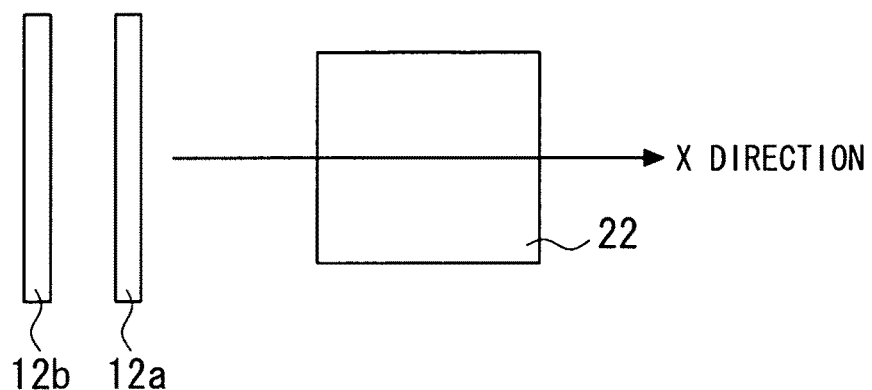
FIG. 21 is a schematic drawing of another apparatus composition for achieving the droplet deposition pattern in the present embodiment.

It is possible to turn the recording head in order to adjust the droplet deposition interval in the column direction in FIGS. 20 and 21. It is also possible to change the ejection period in the recording head in order to adjust the droplet deposition interval in the row direction.

Figure 22A:
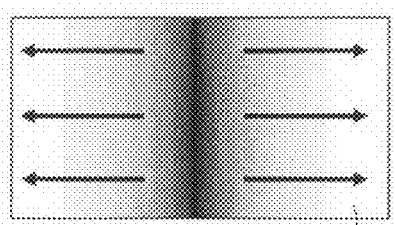
FIGS. 22A and 22B are conceptual views for describing the application of the stamp to the substrate.
Figure 22B:
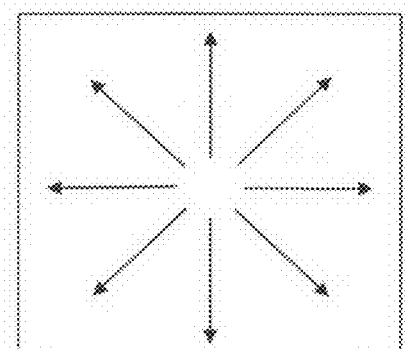

The method of applying the stamp 16 is not limited to the method of progressively bringing the surface of the stamp 16 on which the pattern is formed into contact from one end of the surface by rotating the surface as shown in FIG. 5. For example, as shown in FIG. 22A, it is also possible to apply the stamp progressively from the central portion of the substrate 22 toward the lateral ends; or as shown in FIG. 22B, it is also possible to apply the stamp progressively from the central portion of the substrate 22 toward the ends in all directions.

Thus, the stamp can be placed in contact from the central portion of the substrate 22 and progressively brought into contact with the end portions of the substrate, and furthermore, any placing of the stamp will do as long as air bubbles in the liquid applied on the substrate 22 are removed when the contact is made, not only in the direction from one end to the other end of the substrate 22 or in the direction from the central portion to the end portions of the substrate 22. This can be realized by appropriately designing the mold pattern, or the like.

The pattern transfer apparatus and the pattern forming method according to the embodiments of the present invention can be used suitably in manufacturing processes such as those described below.

A first technological application is a case where the molded shape (pattern) itself is functional and can be applied to a nano-technology component or structural member. Possible examples include micro-nano-optical elements of various types, and structural members of a high-density recording medium, an optical film and a flat panel display. A second technological application is a case where a laminated structure is built by simultaneously molding a micro-structure and a nano-structure in a single body, or by simple positioning between layers, and this is then applied to the manufacture of a µ-TAS (Micro-Total Analysis System) or a biochip. A third technological application is a case where the formed pattern is used as a mask in an application for processing a substrate by an etching method, or the like. Due to the high-precision positioning and increased levels of integration achieved, this technology can be applied in the place of conventional lithographic techniques to the manufacture of high-density integrated semiconductor circuits, the manufacture of transistors on liquid crystal displays, and the processing of magnetic bodies such as next-generation hard disks which are known as "patterned media".

Moreover, the pattern transfer apparatus and the pattern forming method according to the embodiments of the present invention can be also applied to the formation of optical components for a micro-electrical mechanical system (MEMS), sensor element, diffraction grating, relief hologram, and the like, the formation of optical films for the manufacture of a nano device, optical device, and flat panel display, and the formation of permanent films for a polarizing element, thin film transistor, organic transistor, color filter, overcoat layer, rod member, liquid crystal-orienting rib member, micro lens array, immune assay chip, DNA separation chip, micro-reactor, nano-bio device, light guide, optical filter, photonic liquid crystal, anti-reflective (moth eye) structure, and the like.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A pattern transfer apparatus, comprising:
a conveyance device which conveys a substrate having a substrate surface;
a liquid ejection device having a plurality of liquid ejection ports through which droplets of liquid are ejected and deposited onto the substrate surface;
a scanning movement device which is configured to relatively move the substrate and the liquid ejection device to cause the liquid ejection device to scan the substrate surface in a relative scanning direction that is parallel to the substrate surface;
a stamp having a stamp surface on which a pattern is formed, the stamp surface being applied to the droplets of the liquid on the substrate surface in a stamp application direction while the stamp is relatively moved with respect to the substrate;
a control device with a central processing unit and a program storage unit that reads out control programs to control the liquid ejection device and the scanning movement device such that the droplets ejected respectively from at least two different liquid ejection ports of the plurality of liquid ejection ports are deposited onto at least one of a plurality of regions of the substrate surface, the regions being straight and parallel to the stamp application direction and having widths substantially equal to diameters of the droplets deposited on the substrate surface; and
a curing device which cures the liquid on the substrate surface in a state where a whole of the stamp surface is in contact with the liquid on the substrate surface.

2. The pattern transfer apparatus as defined in claim 1, wherein the control device with the central processing unit and the program storage unit reads out control programs to control the liquid ejection device and the scanning movement device such that the droplets ejected respectively from the at least two different liquid ejection ports are deposited onto a line region of the substrate surface, the line region being straight and parallel to the relative scanning direction.

3. The pattern transfer apparatus as defined in claim 2, wherein the control device with the central processing unit and the program storage unit reads out control programs to control the scanning movement device such that the liquid ejection device performs a plurality of relative scanning actions with respect to the substrate surface.

4. The pattern transfer apparatus as defined in claim 2, comprising a plurality of the liquid ejection devices.

5. The pattern transfer apparatus as defined in claim 1, wherein the relative scanning direction and the stamp application direction are not parallel to each other.

6. The pattern transfer apparatus as defined in claim 5, wherein the relative scanning direction and the stamp application direction are substantially perpendicular to each other.

7. The pattern transfer apparatus as defined in claim 1, wherein the control device with the central processing unit and the program storage unit reads out control programs to control the liquid ejection device and the scanning movement device such that the droplets ejected respectively from all of the liquid ejection ports of the liquid ejection device are deposited onto the at least one of the regions of the substrate surface.

8. A method of forming a pattern on a substrate surface of a substrate by transferring a pattern formed on a stamp surface of a stamp to the substrate surface, the method comprising the steps of:

performing liquid ejection to eject and deposit droplets of liquid from a plurality of liquid ejection ports of a liquid ejection device onto the substrate surface;

performing scanning movement to relatively move the substrate and the liquid ejection device to cause the liquid ejection device to scan the substrate surface in a relative scanning direction that is parallel to the substrate surface;

relatively moving the stamp with respect to the substrate to apply the stamp surface to the droplets of the liquid on the substrate surface in a stamp application direction;

using a control device with a central processing unit and a program storage unit that reads out control programs, controlling the liquid ejection and the scanning movement such that the droplets ejected respectively from at least two different liquid ejection ports of the plurality of liquid ejection ports are deposited onto at least one of a plurality of regions of the substrate surface, the regions being straight and parallel to the stamp application direction and having widths substantially equal to diameters of the droplets deposited on the substrate surface; and curing the liquid on the substrate surface in a state where a whole of the stamp surface is in contact with the liquid on the substrate surface, and then removing the stamp surface from the cured liquid.

9. The method as defined in claim 8, wherein in the controlling step, the liquid ejection and the scanning movement are controlled such that the droplets ejected respectively from the at least two different liquid ejection ports are deposited onto a line region of the substrate surface, the line region being straight and parallel to the relative scanning direction.

10. The method as defined in claim 9, wherein in the controlling step, the scanning movement is controlled such that a plurality of relative scanning actions are performed with respect to the substrate surface by the liquid ejection device.

11. The method as defined in claim 9, wherein the liquid ejection is performed with a plurality of the liquid ejection devices.

12. The method as defined in claim 8, wherein the relative scanning direction and the stamp application direction are not parallel to each other.

13. The method as defined in claim 12, wherein the relative scanning direction and the stamp application direction are substantially perpendicular to each other.

14. The method as defined in claim 8, wherein in the controlling step, the liquid ejection and the scanning movement are controlled such that the droplets ejected respectively from all of the liquid ejection ports of the liquid ejection device are deposited onto the at least one of the regions of the substrate surface.

* * * * *

UNITED STATES PATENT AND TRADEMARK OFFICE
CERTIFICATE OF CORRECTION

| | | |
|---|---|---|
| PATENT NO. | : 8,609,006 B2 | Page 1 of 1 |
| APPLICATION NO. | : 12/923027 | |
| DATED | : December 17, 2013 | |
| INVENTOR(S) | : Kenichi Kodama et al. | |

It is certified that error appears in the above-identified patent and that said Letters Patent is hereby corrected as shown below:

Title Page, Item (12) delete "Mataki" and insert --Kodama et al.--.

Title Page, below Item (54) should read Item --(75) Inventors: Kenichi Kodama, Kanagawa-ken (JP); Hiroshi Mataki, Kanagawa-ken (JP);--.

Signed and Sealed this
Eleventh Day of November, 2014

Michelle K. Lee
*Deputy Director of the United States Patent and Trademark Office*